United States Patent [19]
Murakami et al.

[11] Patent Number: 5,254,849
[45] Date of Patent: Oct. 19, 1993

[54] IMAGE READING APPARATUS HAVING LIGHT SHIELDING ELEMENT DISPOSED BETWEEN LIGHT EMITTING ELEMENTS

[75] Inventors: Hiroki Murakami; Masao Funada, both of Kanagawa, Japan

[73] Assignee: Fuji Xerox Co., Ltd., Tokyo, Japan

[21] Appl. No.: 907,664

[22] Filed: Jul. 2, 1992

[51] Int. Cl.$^5$ ................. H01J 40/14; H01L 33/00
[52] U.S. Cl. ........................ 250/208.1; 250/98
[58] Field of Search ............... 250/208.1; 359/50, 60; 358/482, 483, 494, 496; 257/98, 435

[56] References Cited

U.S. PATENT DOCUMENTS

| | | | |
|---|---|---|---|
| 4,682,042 | 7/1987 | Igarashi | 250/208.1 |
| 4,948,966 | 8/1990 | Arques et al. | 250/208.1 |
| 5,015,837 | 5/1991 | Hiroi et al. | 250/208.1 |
| 5,101,099 | 3/1992 | Funada et al. | 250/208.1 |
| 5,115,329 | 5/1992 | Ikarashi et al. | 359/50 |
| 5,124,543 | 6/1992 | Kawashima | 250/208.1 |
| 5,160,835 | 11/1992 | Yagya | 250/208.1 |
| 5,164,580 | 11/1992 | Funada et al. | 250/208.1 |

*Primary Examiner*—David C. Nelms
*Assistant Examiner*—Michael Messinger
*Attorney, Agent, or Firm*—Finnegan, Henderson, Farabow, Garrett & Dunner

[57] ABSTRACT

This disclosure relates to an electroluminescent (EL) device serving as a light emitting device in an image reading apparatus. An electroluminescent device is of a thick film type and well suited for combination with a photosensing device in the form of an integral light emitting and sensing device. The electroluminescent device is provided with a pair of linear light emitting elements spaced apart from each other on a transparent electrode. Each of the light emitting element includes a luminescent layer interposed between a light shielding electrode and a transparent electrode. The luminescent layer is of resin containing fluorescent particles dispersed therein and is obtained by deposition by a thick film technique. The electroluminescent device is further provided with a light shielding element and an optically transmissive area, both of which are formed between the linear light emitting elements. At an interface between the linear light emitting element and the light shielding element, a portion of the light shielding electrode of the linear light emitting element overlies a portion of the light shielding element. The optically transmissive area between the linear light emitting elements is obtained without need for etching the luminescent layer.

9 Claims, 4 Drawing Sheets

IMAGE READING APPARATUS HAVING LIGHT SHIELDING ELEMENT DISPOSED BETWEEN LIGHT EMITTING ELEMENTS

FIELD OF THE INVENTION

The present invention relates to a light emitting device used for an image input device in a facsimile machine, an image scanner, or the like, and more particularly to a light emitting device in which a luminescent layer is formed by a thick film technique that is characterized by low cost manufacturing. The present invention further relates to a method of manufacturing the light emitting device, and to an image reading apparatus incorporating the light emitting device.

BACKGROUND OF THE INVENTION

A prior art image reading apparatus is generally provided with a light emitting diode (LED) as its light source. Recently a more compact image reading apparatus has been proposed, in which a solid state light source such as an electroluminescent (EL) device has been substituted for a light emitting diode (LED). The electroluminescent device used as a light emitting device has been combined with a photosensing device into an integral unit, i.e. an integral light emitting and sensing device, to save space.

FIGS. 6 and 7 show a prior art image reading apparatus of a type having an integral light emitting and sensing device as stated above. It will be observed that the image reading apparatus includes a photoreceptor array 30 comprising an array of photoreceptor elements 31. An electroluminescent device 40 is disposed immediately above the array 30 separated from it by an adhesive layer 50, and provided with optically transmissive areas 60. Each of the optically transmissive area 60 directly overlies a photoreceptor 31. Light emitted from the electroluminescent device 40 is perpendicularly incident upon an original 70, so that uniform illumination can be obtained. Reflected light 80 from the original 70 passes through the optically transmissive area 60 onto the photoreceptors 31. The optical path length of reflected light 80 from the original 70 to the photoreceptors 31 is consequently minimized.

The optically transmissive area 60 of the electroluminescent device 40 is configured in the following manner. A transparent electrode 42, an insulating layer 43, a luminescent layer 44, and an insulating layer 45 are successively deposited on a transparent substrate 41 by a thin film technique known in the art. A light shielding electrode 46 is then deposited and patterned by etching such that rectangular openings 46a are formed therein. Since optically transparent materials are used for the transparent electrode 42, the insulating layers 43 and 45, and the luminescent layer 44, portions of these layers directly overlying the openings 46a formed in the light shielding electrode 46 function as the optically transmissive areas 60.

This configuration of the prior art electroluminescent device, however, requires the electroluminescent device be made of thin films, which entails high manufacturing cost and involves a difficulty in manufacturing a large device. The range of realizable size of a resulting device is limited depending on the size of vacuum chamber used for the thin film process.

On the other hand, there is another type of electroluminescent device in the art, in which a luminescent layer is formed by a thick film technique such as screen printing. Whereas this thick film type electroluminescent device is free from the foregoing problem and difficulty, it suffers from another problem, that of relatively low transmission efficiency. The luminescent layer contains fluorescent particles such as ZnS:(Cu, Al) which are dispersed in an organic binder such as cyanoethylpolyvinylalcohol (CEPVA). The fluorescent particles and the organic binder have their own refractive indexes, which differ from each other. Difference in refractive index causes reflected light from an original to be scattered in the luminescent layer, thus resulting in relatively low transmission efficiency. If an integral light emitting and sensing device is constructed with a thick film type electroluminescent device, portions of the luminescent layer right above the photoreceptors must be removed in order to keep reflected light from scattering. Nevertheless, the luminescent layer has poor resistance to etching, because the organic binder contained in the luminescent layer has high permeability and absorption of water, and a high solubility in organic solvents. In addition to that, it is difficult to form very fine patterns in the luminescent layer, because it is relatively thick, 10 $\mu$m to 100 $\mu$m. In consequence, it is difficult to introduce a thick film type electroluminescent device into a conventional image reading apparatus using a similar configuration to that described above.

SUMMARY OF THE INVENTION

Overcoming several problems and difficulties of the prior art as set forth above, the present invention provides a novel device for light emission, which is of a type called a thick film electroluminescent (EL) device and is well suited for combination with a photosensing device into the form of an integral light emitting and sensing device used for an image reading apparatus.

In addition to the aspect of the present invention discussed above, other aspects include the discovery of how to make the aforementioned thick film electroluminescent device.

Yet another aspect of the present invention is the realization of an image reading apparatus which is adapted to accommodate the thick film type electroluminescent device.

According to one embodiment of the present invention, a light emitting device comprises a pair of linear light emitting elements spaced apart from each other on a transparent electrode. Each of the linear light emitting elements includes a luminescent layer interposed between a light shielding electrode and a transparent electrode. The luminescent layer made of resin containing fluorescent particles dispersed therein is deposited by an appropriate thick film technique. The light emitting device further comprises a light shielding element and an optically transmissive area, both of which are formed between the linear light emitting elements. The optical transmissive area is formed substantially at the center between the linear light emitting elements. At an interface between the linear light emitting element and the light shielding element, a portion of the light shielding electrode of the linear light emitting element overlies a portion of the light shielding element.

A method of manufacturing the light emitting device described above comprises the steps of forming a transparent electrode, forming a light shielding element, forming a luminescent layer, and forming a light shielding electrode. Specifically, a pair of linear transparent electrodes are formed on a transparent substrate. A light sheilding layer is then deposited and patterned such that a light shielding element is formed between the linear transparent electrodes and such that openings serving as optically transmissive areas are formed substantially at the center therebetween. A luminescent layer of resin containing fluorescent particles dispsered therein is then superposed on the linear transparent electrodes by an appropriate thick film technque. Finally, a light shielding electrode is deposited such that the light shielding electrode may over the entire luminescent layer and a portion of the light shielding electrode may overlie a portion of an adjacent extremity of the light shielding layer.

A light emitting device in accordance with a second embodiment has a similar configuration to that of the first embodiment except for a transparent electrode, in which the transparent electrode requires not to be patterned. A method of manufacturing the light emitting device of the second embodiment comprises the steps of forming a transparent electrode, forming a light shielding element, forming a luminescent layer, and forming a light shielding electrode. In detail, a linear transparent electrode is first formed on a transparent substrate. A light shielding layer is then superposed on the transparent electrode and patterned to form a light shielding element and openings defining the optically transmissive areas, such that the light shielding element extends longitudinally at the substantial center of the transparent electrode. A luminescent layer of resin containing fluorescent particles dispersed therein is then deposited by an appropriate thick film technique, to form a pair of linear luminescent layers which are superposed on the linear transparent electrode. Finally, a light shielding electrode is deposited such that the light shielding electrode covers the entire linear luminescent layer and a portion of the light shielding electrode overlies a portion of an adjacent extremity of the light shielding layer.

The present invention further provides an image reading apparatus, which is adapted to accommodate a thick film type electroluminescent device of the present invention. The image reading apparatus comprises a pair of linear light emitting elements spaced apart form each other on a transparent substrate. Each of the linear light emitting elements has a luminescent layer interposed between a light shielding electrode and a transparent electrode. The luminescent layer is obtained by depositing resin containing fluorescent particles dispersed therein. The image reading apparatus also comprises a light shielding element and optically transmissive areas formed between the light emitting elements, such that the optically transmissive areas are positioned substantially at the center between the linear light emitting elements, and such that a portion of the light shielding electrode of the linear light emitting element overlies a portion of the light shielding element at an interface between the linear light emitting element and the light shielding element. Moreover, the image reading apparatus comprises photoreceptors, each of which faces directly toward one optically transmissive area. Consequently, emitted light from the light emitting elements is reflected by an original placed on the opposite side of the transparent substrate from the light emitting elements, passes through the optically transmissive areas, and falls upon the photoreceptors.

An advantage of the light emitting devices according to the present invention is its configuration, in which a pair of linear light emitting elements are spaced apart from each other on a transparent electrode and a light shielding element is formed between the linear light emitting elements. This configuration allows the optically transmissive area to be realized between linear light emitting elements without need for etching the luminescent layers of the light emitting elements.

According to the methods for manufacturing the light emitting device of the present invention, a pair of luminescent layers of the linear light emitting elements are formed apart from each other in order to accommodate a light shielding layer between the luminescent layers, and optically transmissive areas are formed in the light shielding layer. With this configuration, a thick film technique can be applied for depositing the luminescent layer.

An advantage of the image reading apparatus of the present invention lies in the disposition of its constituent elements. The optically transmissive areas permitting light to pass through are formed between a pair of linear light emitting elements in face to face orientation with the photoreceptors. Thus, reflected light from an original is introduced through the optically transmissive areas upon the photoreceptors.

DETAILED DESCRIPTION OF THE PREFERRED EMBODIMENTS

Figure 1A:
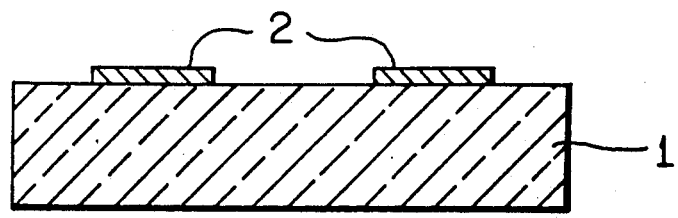
FIG. 1 shows in schematic cross-sectional view a light emitting device in progress of manufacture according to a first embodiment of the present invention, in which views 1(a), 1(b), 1(c), 1(d) and 1(e) illustrate which layers are superposed in each step and how.
Figure 1B:
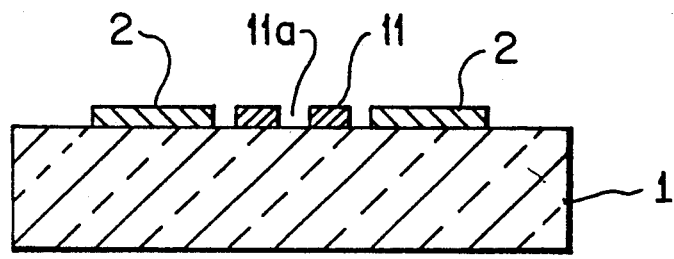
Figure 1C:
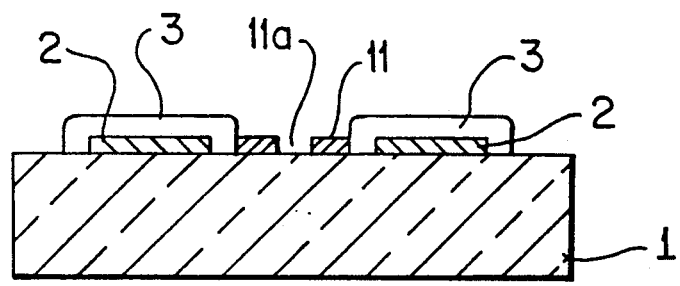
Figure 1D:
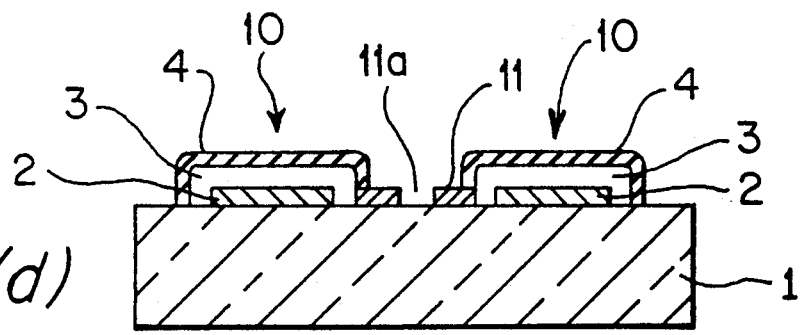
Figure 1E:
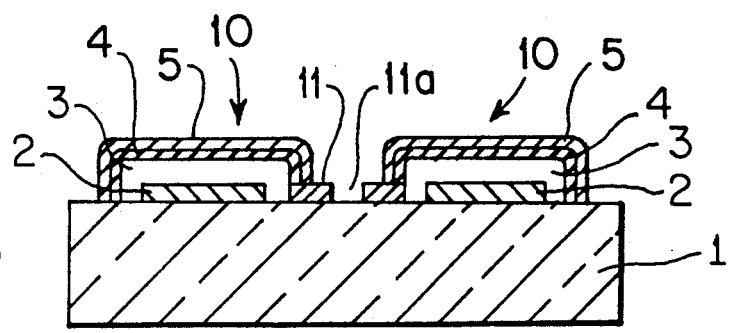
Figure 2A:
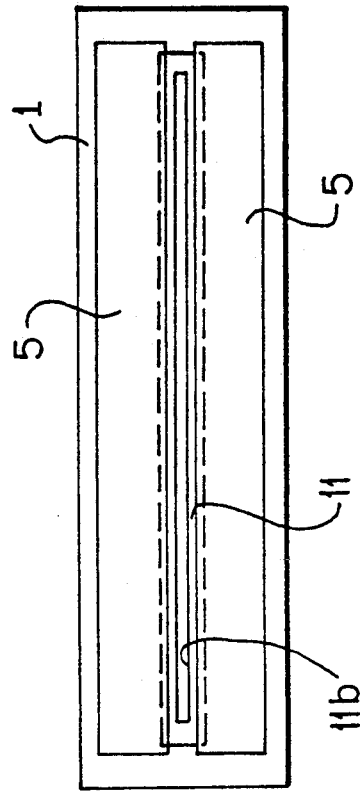
FIG. 2 shows in plan view different two types of light emitting device according to the present invention, in which 2(a) is a view of the light emitting device of the first embodiment shown in FIG. 1(e), and 2(b) is a view of a possible variation of the first embodiment of the light emitting device.

Referring now to FIGS. 1(e) and 2(a), a first embodiment of an electroluminescent device according to the present invention will be described. FIG. 1(e) is a schematic cross section taken on line A—A of FIG. 2(a). As shown in these figures, the electroluminescent device comprises a pair of linear light emitting elements 10 spaced apart from each other on a transparent substrate 1. Each of the linear light emitting elements 10 has a layered configuration, in which a luminescent layer 3 and a dielectric layer 4 are interposed between a light shielding electrode 5 and a transparent electrode 2. The luminescent layer 3 is made by depositing resin containing fluorescent particles dispersed therein by an appropriate thick film technique. Between the linear light emitting elements 10, a light shielding element 11 is formed, which is made from a light shielding layer deposited between the transparent electrodes 2. The light shielding layer also contains a number of rectangular openings 11a aligned in the longitudinal direction as shown in FIG. 2(a). Each of the openings 11 is for a photoreceptor which will be described later. At an interface between the light shielding element 11a and the linear light emitting element 10, a portion of the light shielding electrode 5 overlies a portion of the light shielding element 11, so that emitted light from luminescent layer 3 will not leak outside the light shielding electrode 5. In operation, an AC voltage applied between the transparent electrode 2 and the light shielding electrode 5 across the luminescent layer 3 creates a high electric field in the luminescent layer 3, which excites electrons therein. The excited electrons, in turn, cause collisional excitation of luminous centers in the luminescent layer 3. When the excited luminous centers fall back to the basic state, light is emitted. Emitted light from the luminescent layer 3 goes only toward the opposite side of transparent substrate 1 from the linear light emitting element 10 because the light shielding electrode 5 is not transmissive to light.

A method of manufacturing the electroluminescent device of the first embodiment will be explained with reference to FIG. 1(a) to (e) in sequence. A transparent conductive layer of indium tin oxide, for example, of a sheet resistance of 50Ω/□ is deposited to a thickness of 100 nm on a transparent substrate 1 by electron beam vapor deposition. The transparent substrate 1 has a thickness of 50 μm and made of boro-silicate glass, for example. The deposited transparent conductive layer is then patterned by a photolithography process, to form a pair of linear transparent electrodes 2 disposed apart form each other (see FIG. 1(a)).

A light shielding layer of photosensitive organic material, such as a material of the type produced by Fuji Hunt Electronics Technology Co. Ltd. (Japan) under the name Color Mosaic CK-2000 (light transmittance of 0.5%), is deposited over the linear transparent electrodes 2 by spin coating. The light shielding layer is then patterned by a photolithography process to form a light shielding element 11 and opening 11a between the linear transparent electrodes 2 (see FIG. 1(b)). The light shielding layer, which is made of photosensitive organic material, requires no photo-resist for photolithographical patterning.

A luminescent layer 3 is printed to a thickness of 30 μm over each of the linear transparent electrodes 2 by screen printing, and then dried (see FIG. 1(c)). The material of the luminescent layer is preferably of a type which contains fluorescent substances dispersed in an organic binder of cyanoethylcellulose. The fluorescent substance is composed of a luminescent host material doped with activators. The luminescent host material is preferably zinc sulfide (ZnS) of an average particle diameter of 10 μm, and the activators are preferably copper (Cu) in a proportion of 0.08% and aluminium (Al) in a proportion of 0.02%. Alternatively, it would be desirable to employ a material of a type made by classifying one or more of ZnS:(Cu, Cl) ZnS:(Cu, Br), ZnS:(Cu, Mn, Cl), and ZnCdS:(Cu, Br), and then mixing it well with a binder material such as acetal resin, epoxy resin, methylmethacrylate resin, polyester resin, cyanoethyl-cellulose resin, or fluororesin.

A dielectric layer 4 is printed to a thickness of 10 μm on the luminescent layer 3 by screen printing, and then dried (see FIG. 1(d)). The material of the dielectric layer is preferably of a type which contains $BaTiO_3$ of an average particle diameter of 1 μm dispersed in an organic binder of cyanoethylepolyvinylalcohol. Otherwise, it would be acceptable to make the dielectric layer 4 by an appropriate thick film technique such as screen printing, or spray plating with a dielectric material such as low melting glass, cyanoetylcellulose, vinylidene fluoride tricomponent copolymer, vinylidene fluoride-trifluoroethylene copolymer, epoxy resin, or silicone resin.

Next, about 30 μm of light shielding electrode 5 was formed by printing a conductive paste with conductive particles such as silver and carbon dispersed in the epoxy resin (For example, CT-222FT available from Toshiba Chemical Co., Ltd.) on the dielectric layer 4 by screen printing and then by applying baking to the conductive paste at 100° C. for from 30 to 60 minutes.

Figure 2B:
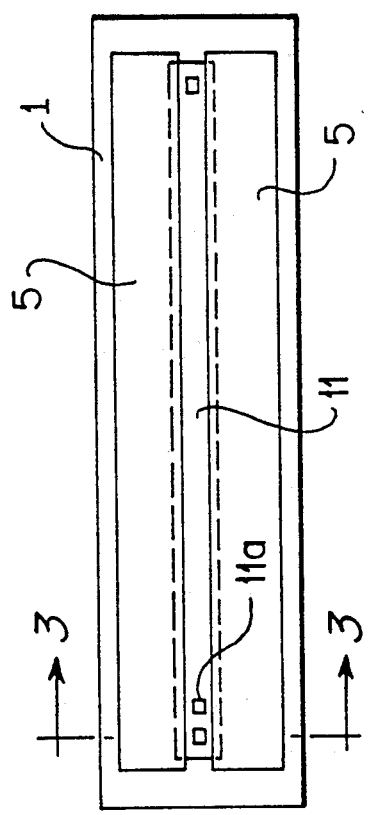

As can be seen in FIG. 2(a), the electroluminescent device of the first embodiment has a plurality of openings 11a in the light shielding element 11. A possible variation of the electroluminescent device is shown in FIG. 2(b), in which a single elongated opening 11b extends in the longitudinal direction of the linear transparent electrodes 2.

The first embodiment of the electroluminescent device employs a borosilicate glass as the transparent substrate 1, which can be equally replaced with a glass of any other type, a film such as PET, an epoxy layer, or the similar, as long as it is optically transmissive.

According to the first embodiment, though the linear transparent electrode 2 is subjected to a photolithography process, the luminescent layer 3 and the dielectric layer 4 are not subjected to a photolithography process nor an etching process after their deposition. Therefore, materials which have poor resistance to etching can be used for the luminescent layer 3 and the dielectric layer 4, resulting in a wider range of choice of material.

Figure 3:
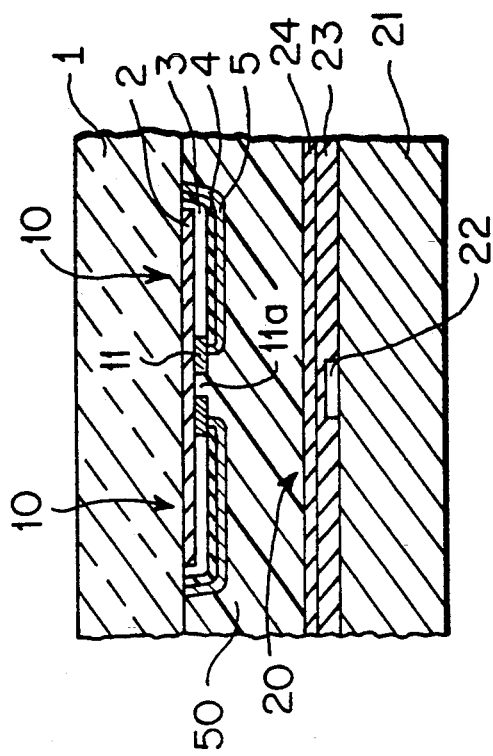
FIG. 3 is a schematic cross-sectional view of an image reading apparatus which comprises the light emitting device of the first embodiment made in accordance with the steps as shown in FIG. 1.

An exemplary image reading apparatus will now be described referring to FIG. 3, which has been adapted to accommodate an electroluminescent device using the same basic mechanism as that of the first embodiment. It will be observed that an electroluminescent device is combined with a photoreceptor array 20 by an optically transmissive adhesive layer 50. A photoreceptor array 20, the length of which is substantially the width of an original, is disposed on a substrate 21, such that openings 11a of the electroluminescent device directly overlies corresponding photoreceptors 20a which are aligned in the fast scan direction (from front to back as viewed from FIG. 3) in the photoreceptor array 20. Each of the photoreceptors 20a has a thin film layered configuration, in which a linear photoconductive layer 23 of amorphous silicon (a-Si) is interposed between an individual electrode 22 of chromium (Cr) and a common electrode 24 of indium tin oxide. A plurality of the individual electrodes 22 are spaced apart from one another in the direction from front to back as viewed from FIG. 3 and the common electrode 24 extends longitudinally from front to back as viewed from FIG. 3.

In operation, an AC voltage of from 50 V to 250 V is applied between the transparent electrode 2 and the light shielding electrode 5 of the electroluminescent device to cause light emission of the luminescent layer 3 interposed between the electrodes. Emitted light irradiates an original 70 placed on the opposite side of the transparent substrate 1 from the light emitting device. Reflected light 80 from the original 70 passes through the optically transmissive areas 11 and falls upon the photoreceptors 20a which directly underlie the openings 11, to cause electric charges to be generated in the photoreceptors 20a. In response to the actions of a driver IC (not shown), the electric charges generated in the photoreceptor 20a are transferred to be read out in the form of electric signals representing an image of a scanned original.

Applying an electroluminescent device of the type shown in FIG. 2(a) to the aforementioned image reading apparatus, higher resolution may be achieved compared with applying the other type of electroluminescent device shown in FIG. 2(b). In the electroluminescent device shown in FIG. 2(a), the laterally gapped openings 11a in the light shielding element 11 prevent stray reflected light from reaching photoreceptors 20a directly underlying the openings 11a, so that the each of the photoreceptors 20a can receive reflected light only from a portion of the original right above the photoreceptor 20a.

Next, a description will be made of a second embodiment of an electroluminescent device and a method of manufacturing the same with reference to FIG. 4(a) to (e) in sequence. The electroluminescent device according to the second embodiment of the present invention includes an unpatterned transparent electrode 2', on which light shielding element 11 is superposed. Other than the above, as the electroluminescent device of the second embodiment has a similar configuration to that of the first embodiment, like reference numerals have been used to identify like members in these figures.

A method of manufacturing the electroluminescent device of the second embodiment includes the following steps. A metallic mask with an opening in a desired shape coverers a transparent substrate 1 made of glass, plastic, or the like. A transparent conductive layer of indium tin oxide, for example, is then deposited thereon to a thickness of 100 nm by electron beam vapor deposition to form transparent electrode 2' (see FIG. 4(a)).

A light shielding layer of photosensitive organic material, such as a material of the type produced by Fuji Hunt Electronics Technology Co. Ltd. (Japan) under the name Color Mosaic CK-2000 (light transmittance of 0.5%), is deposited over the transparent electrode 2' by spin coating. The light shielding layer is then patterned by a photolithography process to form a light shielding element 11 and openings 11a (see FIG. 4(b)).

Figure 4A:
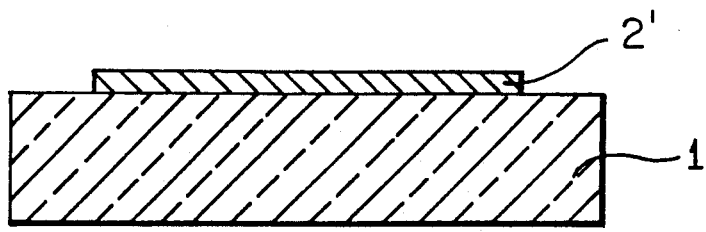
FIG. 4 shows in schematic cross-sectional view a light emitting device in process of manufacture according to a second embodiment of the present invention, in which views 4(a), 4(b), 4(c), 4(d), and 4(e) illustrate which layers are superposed in each step and how.
Figure 4B:
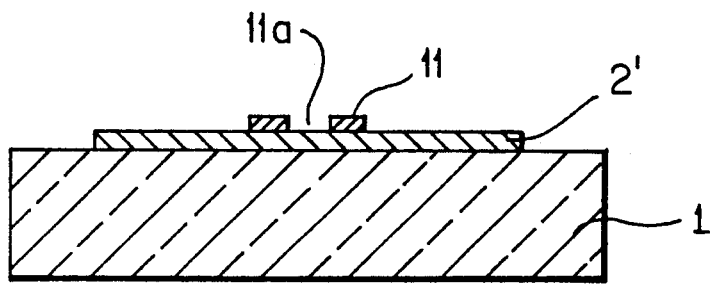
Figure 4C:
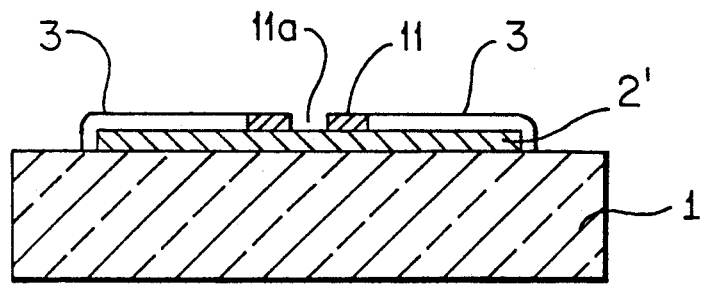

By screen printing, a luminescent layer 3 is printed to a thickness of 30 μm over portions of the transparent electrode 2' on both outsides of the light shielding element 11, and then dried (see FIG. 4(c)). The material of the luminescent layer is similar to that described in the manufacturing method of the first embodiment with reference to FIG. 1.

Figure 4D:
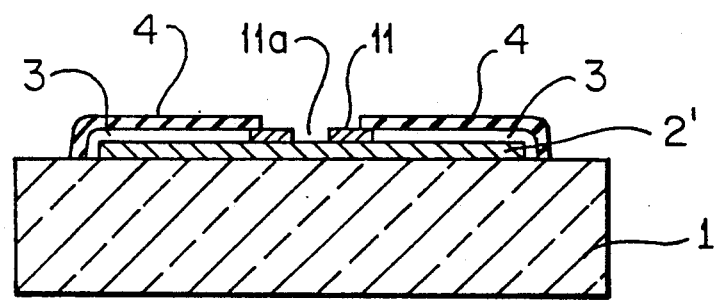

A dielectric layer 4 is printed to a thickness of 10 μm on the luminescent layer 3 by screen printing, and then dried (see FIG. 4(d)). The material of the dielectric layer is similar to that described in the manufacturing method of the first embodiment with reference to FIG. 1.

Figure 4E:
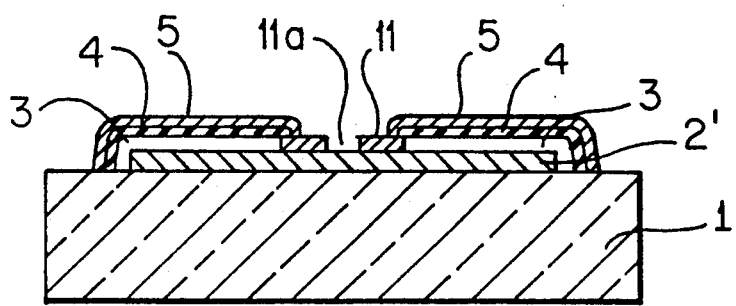
Figure 6:
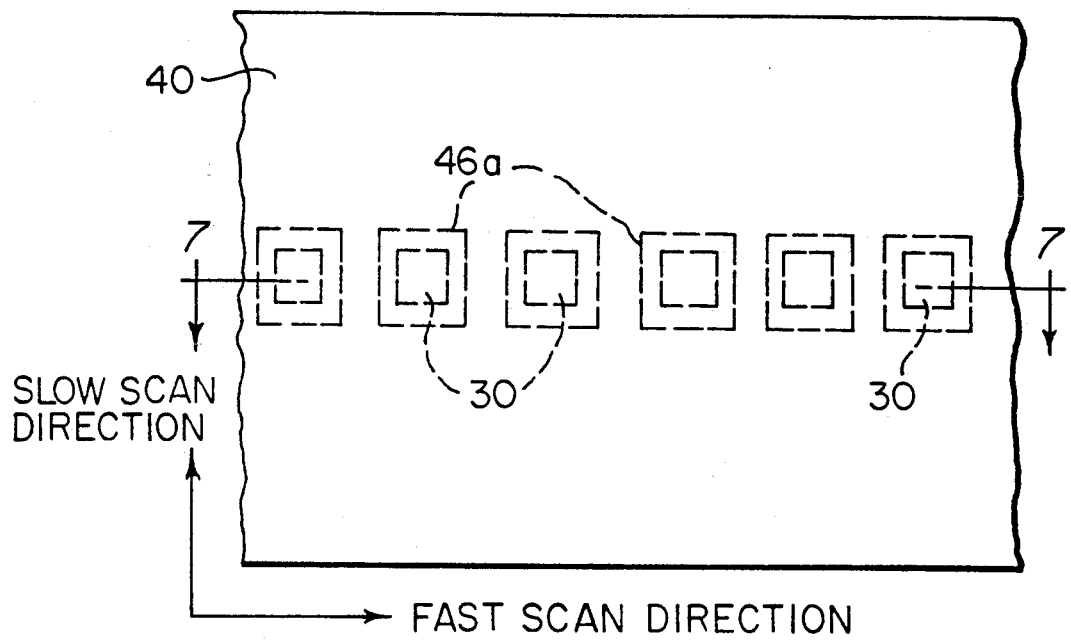
FIG. 6 is a plan view of a prior art image reading apparatus including an integral light emitting and sensing device.
Figure 7:
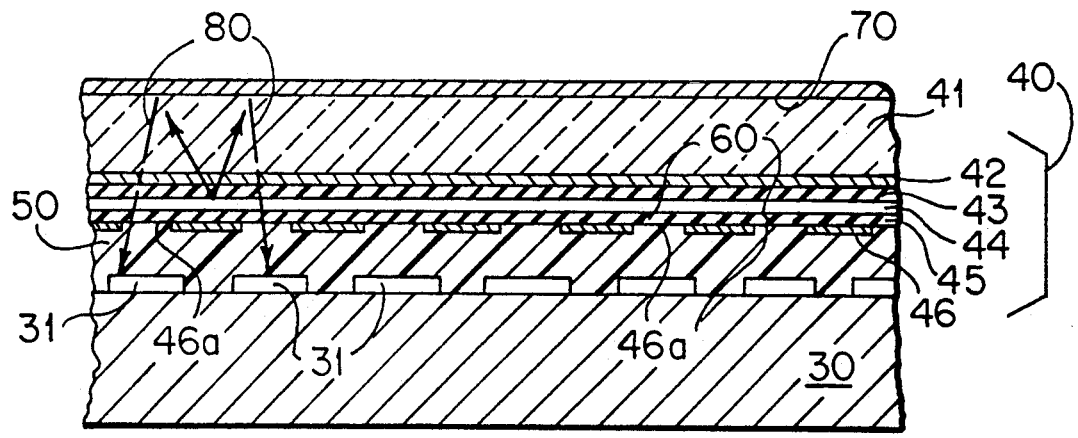
FIG. 7 is a schematic cross-sectional view taken along line X—X of FIG. 6.

With a metallic mask placed over the resulting substrate for masking portions of the substrate not underlying the dielectric layer 4, a light shielding electrode 5 of aluminium (Al) is deposited to a thickness of 0.1 μm by vapor deposition (see FIG. 4(e)).

Figure 5:
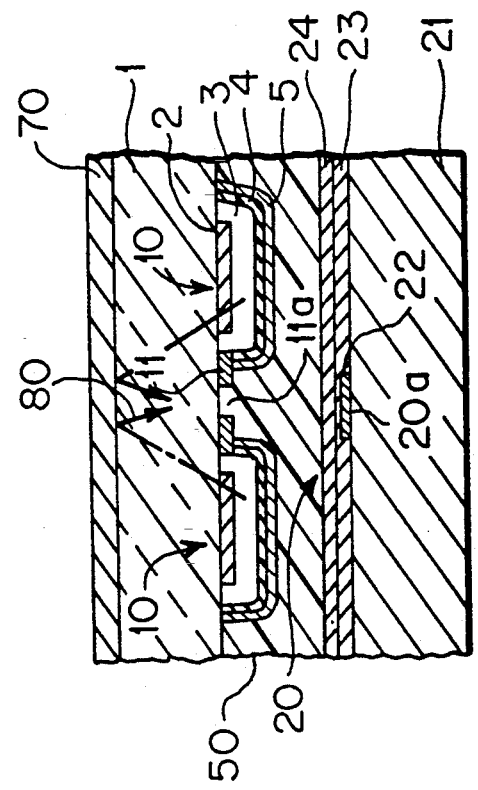
FIG. 5 is a schematic cross-sectional view of a image reading apparatus which comprises the light emitting device of the second embodiment made in accordance with the steps as shown in FIG. 4.

FIG. 5 shows another exemplary image reading apparatus, which has been adapted to accommodate the electroluminescent device of the second embodiment. In FIG. 5, members corresponding functionally to those which have been described with reference to FIG. 3 are designated by the same reference numerals, and their detailed descriptions are not repeated here.

In conformity with the present invention, several advantages are achieved. The luminescent layer 3, the dielectric layer 4, and the light shielding electrode 5 of the electroluminescent device are formed by thick film techniques, which require a lower manufacturing cost for the electroluminescent device as well as the image reading apparatus employing the electrolyminescent device. In addition to that, thick film techniques do not limit the range of the depositable area, which allows a larger electroluminescent device to be realized.

Another advantage is that the opening 11a or the opening 11b of the electroluminescent device can be obtained without need for patterning the luminescent layer 3, the dielectric layer 4, and the light shielding electrode 5. Accordingly, these layers are kept from deterioration or damage resulting from etching, and in consequence, the yield rate on the electroluminescent device can be increased.

What is claimed is:

1. A light emitting device comprising:
    a transparent substrate having a surface;
    a pair of light emitting elements disposed apart from each other on said surface of said transparent substrate; and
    a light shielding element disposed on said surface of said transparent substrate between said light emitting elements, an interior portion of said light shielding element being optically transmissive.

2. A light emitting device according to claim 1, wherein said light emitting element includes;
    a transparent electrode disposed on said surface of said transparent substrate;
    a light shielding electrode extending to said light shielding element; and
    a luminescent layer interposed between said light shielding electrode and said transparent electrode.

3. A light emitting device according to claim 2, wherein said luminescent layer comprises a resin containing fluorescent particles dispersed therein.

4. A method of manufacturing a light emitting device comprising the steps of:
    forming a pair of linear transparent electrodes spaced apart from each other on a surface of a transparent substrate;
    forming a light shielding element between said transparent electrodes on said surface of said transparent substrate, in which a light shielding layer is deposited on said surface of said transparent substrate and said transparent electrodes and patterned to form said light shielding element between said linear transparent electrodes and to form an opening at an interior portion of said light shielding element to serve as an optically transmissive area;
    forming a luminescent layer superposed on said linear transparent electrode, said luminescent layer comprising a resin containing fluorescent particles dispersed therein; and
    forming a light shielding electrode covering said luminescent layer, a portion of said light shielding electrode overlaying a portion of said light shielding element.

5. A method of manufacturing a light emitting device comprising the steps of:

forming a linear transparent electrode on a transparent substrate;

forming a light shielding element, in which a light shielding layer is deposited on said linear transparent electrode and then patterned, so that said light shielding element extends in a longitudinal direction of said linear transparent electrode on an interior portion thereof and such that an opening serving as an optically transmissive area is formed at an interior portion of said light shielding element;

forming a pair of linear luminescent layers superposed on said linear transparent electrode, in which said linear luminescent layers comprises a resin containing fluorescent particles dispersed therein; and forming a pair of a light shielding electrodes such that said light shielding electrodes respectively cover said linear luminescent layers and portions of said light shielding electrodes overlie portions of said light shielding element.

6. An image reading apparatus comprises:

a transparent substrate having a first surface;

a pair of light emitting elements disposed apart from each other on said first surface of said transparent substrate;

a light shielding element disposed on said first surface of said substrate between said light emitting elements, an interior portion of said light shielding element being optically transmissive; and a photoreceptor disposed in face to face orientation with said optically transmissive interior portion of said light shielding element;

wherein emitted light from said light emitting element is reflected by an original placed on a second surface of said transparent substrate opposite from said first surface, and reflected light passes through said optically transmissive area and falls upon said photoreceptor.

7. An image reading apparatus according to claim 6, wherein said light emitting elements includes;

a transparent electrode disposed on said surface of said transparent substrate;

a light shielding electrode extending to said light shielding element; and a luminescent layer interposed between said light shielding element; and a luminescent layer interposed between said light shielding electrode and said transparent electrode.

8. An image reading apparatus according to claim 6, wherein said luminescent layer and comprises a resin containing fluorescent particles dispersed therein.

9. A light emitting device comprising:

a transparent substrate having a surface;

a transparent electrode formed on said surface of said transparent substrate;

a light shielding element formed on a central portion of a surface of said transparent electrode, an interior portion of said light shielding element being optically transmissive a light shielding electrode disposed on each side of said light shielding element and extending to said light shielding element; and a luminescent layer disposed between said transparent electrode and said light shielding electrode on each side of said light shielding element.

* * * * *

UNITED STATES PATENT AND TRADEMARK OFFICE
CERTIFICATE OF CORRECTION

PATENT NO. : 5,254,849
DATED : October 19, 1993
INVENTOR(S) : Hiroki Murakami et al.

It is certified that error appears in the above-indentified patent and that said Letters Patent is hereby corrected as shown below:

On the title page: Item [56]

Foreign Application Priority Data, front page, add --July 5, 1991 [JP]  Japan..........3-191274--.

Abstract, Item [57] line 9, change "element" to --elements--.

Claim 5, column 9, line 18, change "comprises" to --comprise--.

UNITED STATES PATENT AND TRADEMARK OFFICE
CERTIFICATE OF CORRECTION

PATENT NO. : 5,254,849
DATED : October 19, 1993
INVENTOR(S) : Hiroki Murakami et al It is certified that error appears in the above-indentified patent and that said Letters Patent is hereby corrected as shown below:

Claim 5, column 9, line 21, before "light" delete --a --.

Claim 7, column 10, delete lines 16-17.

Claim 8, column 10, line 21, delete "and".

Signed and Sealed this

Sixth Day of September, 1994

Attest:

BRUCE LEHMAN

*Attesting Officer*      *Commissioner of Patents and Trademarks*